(12) United States Patent
MacPherson et al.

(10) Patent No.: US 10,457,443 B1
(45) Date of Patent: Oct. 29, 2019

(54) ADJUSTABLE PALLET

(71) Applicant: INTERNATIONAL BUSINESS MACHINES CORPORATION, Armonk, NY (US)

(72) Inventors: Michael J. MacPherson, Elgin, MN (US); Jason S. Lee, Oronoco, MN (US); Clinton W. Erie, Adams, MN (US); Ryan Paske, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/193,155

(22) Filed: Nov. 16, 2018

(51) Int. Cl.
*B65D 19/00* (2006.01)
*B65D 19/40* (2006.01)
*H05K 7/14* (2006.01)

(52) U.S. Cl.
CPC ........... *B65D 19/40* (2013.01); *H05K 7/1497* (2013.01); *B65D 2519/00761* (2013.01); *B65D 2519/00805* (2013.01)

(58) Field of Classification Search
CPC ..................... B65D 19/40; B65D 2519/0055
USPC ........................................................ 108/54.1
See application file for complete search history.

(56) References Cited

U.S. PATENT DOCUMENTS

| | | | | |
|---|---|---|---|---|
| 2,405,535 A | * | 8/1946 | Weiss ..................... | B65D 19/38 108/54.1 |
| 2,739,776 A | * | 3/1956 | Terando ............. | B65D 19/0002 108/54.1 |
| 2,873,934 A | * | 2/1959 | Settles ............... | B65D 19/0097 108/54.1 |
| 2,909,349 A | * | 10/1959 | Morris ............... | B65D 19/0002 108/54.1 |
| 2,909,350 A | * | 10/1959 | Morris ............... | B65D 19/0097 108/54.1 |
| 2,942,827 A | * | 6/1960 | Edson ................ | B65D 19/0028 108/54.1 |
| 3,168,205 A | | 2/1965 | Green | |
| 3,329,103 A | * | 7/1967 | Cohen ................ | B65D 19/0095 108/54.1 |
| 3,523,507 A | * | 8/1970 | Dubin .................... | B65D 19/40 108/57.12 |
| 3,695,187 A | | 10/1972 | Weiss | |
| 3,807,581 A | | 4/1974 | Nichols | |

(Continued)

FOREIGN PATENT DOCUMENTS

EP        1701602 A1    9/2016

*Primary Examiner* — Matthew W Ing
(74) *Attorney, Agent, or Firm* — Tihon Poltavets, Esq.; Kevin P. Radigan, Esq.; Heslin Rothenberg Farley & Mesiti P.C.

(57) ABSTRACT

Adjustable pallets are provided which include a deck to support a product for shipping. The deck is selectively positionable in a raised position, as a horizontal support surface for the product, and in a lowered position, closer, at least in part, to a floor to facilitate loading the product on or unloading the product from the pallet. Further, the adjustable pallet includes a movable support, the movable support includes an inclined plane. The deck rests on the movable support in the raised position, and the deck traverses, at least in part, the inclined plane of the movable support when the deck is transitioned between the raised position and the lowered position.

20 Claims, 6 Drawing Sheets

(56) References Cited

U.S. PATENT DOCUMENTS

| | | | | |
|---|---|---|---|---|
| 3,858,723 | A | * | 1/1975 | Weiss ............... B65D 19/44 108/54.1 |
| 3,977,333 | A | * | 8/1976 | Phillips ............ B65D 19/0073 108/54.1 |
| 4,325,669 | A | | 4/1982 | Schafer |
| 5,664,991 | A | | 7/1997 | Prevot et al. |
| 5,673,513 | A | * | 10/1997 | Casimaty ............ B65D 19/38 47/65.9 |
| 5,706,738 | A | * | 1/1998 | Rapeli ............... B63B 25/22 108/54.1 |
| 5,842,424 | A | | 12/1998 | Prevot et al. |
| 5,868,080 | A | | 2/1999 | Wyler et al. |
| 7,044,066 | B1 | * | 5/2006 | Miller ............... B65D 19/44 108/54.1 |
| 8,092,127 | B2 | | 1/2012 | Gao et al. |
| 9,701,330 | B2 | | 7/2017 | Mkandawire et al. |
| 2003/0209172 | A1 | * | 11/2003 | Brennan, Jr. ...... B65D 19/0002 108/54.1 |
| 2009/0090281 | A1 | | 4/2009 | Huettner et al. |
| 2018/0111717 | A1 | | 4/2018 | Jiang |
| 2018/0127147 | A1 | | 5/2018 | Embleton et al. |

\* cited by examiner

ADJUSTABLE PALLET

BACKGROUND

An original equipment manufacturer (OEM) of rack-mounted computing equipment ships palletized racks that can be relatively tall, such as two meters tall, and weight 2,000 lbs. or more. Unloading a computing rack from its shipping pallet can be a hazardous undertaking. Most unloading methods today utilize a separate ramp that is attached to an end of the pallet, and then the rack is rolled down the ramp, with a number of people guiding the rack. This approach has a number of drawbacks, including that the rack could roll in an uncontrolled manner when being unloaded. For instance, the rack could tip forward as it rolls down the ramp, if not loaded properly, or if not controlled properly. Further, the ramp represents an additional part that needs to be provided and shipped by the OEM, and then handled by the customer. Also, the existence of the ramp increases shipping costs, and multiple people are still required to unload the computing rack from the pallet using an attached ramp, and the rack may not be reloadable on the pallet without special equipment.

SUMMARY

Shortcomings of the prior art are overcome and additional advantages are provided herein through the provision, in one or more aspects, of an adjustable pallet. The adjustable pallet includes a deck, and a movable support. The deck supports a product for shipping, and is selectively positionable in a raised position, as a horizontal support surface for the product, and in a lowered position, closer, at least in part, to a floor to facilitate unloading the product from the deck of the adjustable pallet. The movable support includes an inclined plane, and the deck rests on the movable support in the raised position, and traverses, at least in part, the inclined plane of the movable support when transitioning between the raised position and the lowered position.

In another aspect, an adjustable pallet is provided which includes a deck, a movable support, and an adjustment mechanism. The deck supports a product for shipping, and is selectively positionable in a raised position, as a horizontal support surface for the product, and in a lowered position, closer, at least in part, to a floor to facilitate unloading the product from the deck of the adjustable pallet. The movable support includes an inclined plane, and the deck rests on the movable support in the raised position, and traverses, at least in part, the inclined plane of the movable support when transitioning between the raised position and the lowered position. The adjustment mechanism mechanically couples to a pallet structure of the adjustable pallet disposed below the deck. The adjustment mechanism extends between the pallet structure and the movable support, and operatively moves the movable support horizontally to allow the deck to traverse, at least in part, the inclined plane of the movable support, and thereby transition between the raised position and the lowered position. The adjustment mechanism is a mechanical adjustment mechanism which includes a horizontally-extending threaded rod.

In a further aspect, a method of fabricating an adjustable pallet is provided. The method includes providing a deck to support a product for shipping. The deck is selectively positionable in a raised position, as a horizontal support surface for the product, and in a lowered position, closer, at least in part, to a floor to facilitate unloading the product from the pallet. The method also includes supporting the deck, at least in part, by a movable support. The movable support includes an inclined plane, and the deck rests on the movable support in the raised position. The deck traverses, at least in part, the inclined plane of the movable support when the deck is transitioned between the raised position and the lowered position.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
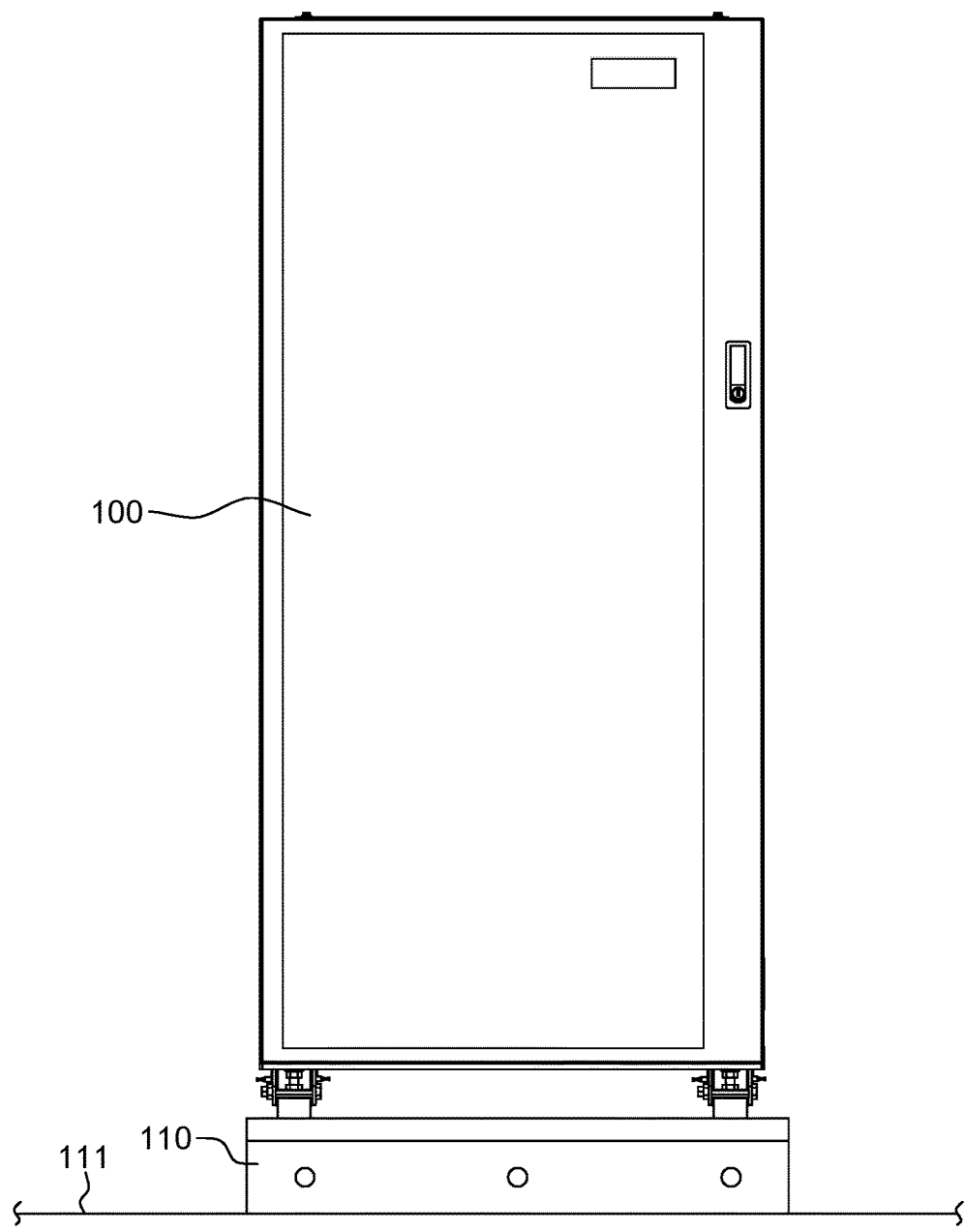
FIG. 1 depicts one embodiment of a product on an adjustable pallet, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and the specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, providing an adjustable pallet, in accordance with one or more aspects of the present invention.

Note that, as used herein, the term product refers generally to any product, package, apparatus, machine, container, cabinet, rack, etc., that may benefit from being shipped on an adjustable pallet, such as disclosed herein. As one example, the product can be a computer rack, which conventionally is a high value product, and relatively tall, and potentially top heavy, and therefore prone to tipping during loading on or unloading from a pallet.

Products, including computer racks, are often transported in packages that can include or reside on a pallet. The pallet is conventionally a rigid structure with a bottom deck board, a top deck board, and sidewalls between the top and bottom deck boards. The boards and sidewalls of the pallet define a pallet interior into which tines of a fork lift, pallet jack or other semi-manual device can be inserted so that the pallet, package and product inside the package can be lifted and moved.

As noted, when a crane or lift is unavailable, unloading a product, such as a computer rack, from a pallet can be a challenging exercise due, in part, to the height and weight of the product. One unloading approach today is to utilize a separate ramp that attaches to an end or side of the pallet, with the product being rolled down the ramp, as a number of people guide the product. This approach has several drawbacks. For instance, the incline of the ramp could be too steep, allowing the product to roll in an uncontrolled manner down the ramp, or the product could tip forward as it rolls down the ramp, particularly if not loaded properly. Further, ramps used today are additional parts that the customer must handle and store, and that the factory needs to provide and ship. Also, a ramp might cost $35 or more, which incrementally increases shipping costs. Further, multiple people are required to unload a wheeled product from a pallet using a ramp, and the product may not be reloadable on the pallet at the customer site without special lift equipment.

Disclosed herein, therefore, are adjustable pallets which include a deck and a movable support. The deck supports a product for shipping, and is selectively positionable in a raised position as a horizontal support surface for the product, and in a lowered position, closer, at least in part, to a floor to facilitate loading of the product on or unloading of the product from the pallet. The movable support includes an inclined plane, and the deck rests on the movable support in the raised position, and traverses, at least in part, the inclined plane of the movable support when the deck is transitioned between the raised and lowered positions.

In one or more implementations, the adjustable pallet also includes an adjustment mechanism mechanically coupled to a pallet structure disposed below the deck. The adjustment mechanism extends between the pallet structure and the movable support, and operatively moves or slides the movable support horizontally to allow the deck to traverse, at least in part, the inclined plane of the movable support, thereby transitioning the deck between the raised position and the lowered position. In one or more embodiments, the adjustment mechanism is, or includes, a mechanical adjustment mechanism extending in a horizontal direction beneath, at least in part, the deck. Also, in one or more embodiments, the adjustment mechanism facilitates horizontally sliding the movable support from beneath the deck in the raised position to outward, at least in part, from beneath the deck in the lowered position.

In one or more embodiments, the movable support is a first movable support, and the adjustable pallet further includes a second movable support. The second movable support includes an inclined plane, and the deck also rests on the second movable support in the raised position. The deck further traverses, at least in part, the inclined plane of the second movable support when the deck is transitioned between the raised position and the lowered position. A first edge of the deck resides on the first movable support in the raised position, and a second edge on the second movable support in the raised position, where the first edge and the second edge are opposite edges of the deck. Further, in one or more implementations, the adjustment mechanism mechanically couples to a pallet structure disposed below the deck, and extends between the pallet structure and the first movable support, and between the pallet structure and the second movable support. The adjustment mechanism operatively moves each of the first movable support and the second movable support horizontally, either separately or together, so as to move the movable supports away from each other to allow the deck to traverse, at least in part, the inclined planes of the first and second movable supports as the deck is transitioned from the raised position to the lowered position.

Further, in one or more embodiments, the inclined plane of the first movable support is at a first angle, and the inclined plane of the second movable support is at a second angle, where the second angle is greater than the first angle.

In certain embodiments, the first movable support and/or second movable support can further include a product stop extending upwards when in operational position from the movable support to facilitate controlling the product on the deck during transitioning of the deck between the raised position and the lowered position.

In one or more implementations, the adjustable pallet further includes a fixed support, with the deck being hingedly coupled to the fixed support at a first edge of the deck, and residing on the movable support at a second edge, in the raised position, where the first edge and the second edge are opposite edges of the deck. With this configuration, in a lowered position, the deck is operatively angled as a ramp.

Reference is made below to the drawings (which may not be drawn to scale to facilitate understanding of the invention), wherein the same reference numbers used throughout different figures designate the same or similar components.

By way of example, FIG. 1 depicts one embodiment of a product 100 residing on a pallet 110, such as an adjustable pallet disclosed herein, with the palletized product shown residing on a floor 111, such as the floor of a data center in the case where product 100 is a computing or IT rack. As noted, with many palletized products, product 100 can be a wheeled product which is relatively tall and potentially top-heavy, depending on the arrangement of components within the product. To facilitate removal of product 100 from pallet 110, the pallet is herein made adjustable by providing an adjustable upper deck that is selectively positionable in a raised position, as a horizontal support surface for the product, as shown in FIG. 1, and in a lowered position, closer, at least in part, to a floor to facilitate loading the product on or unloading the product from the pallet, as shown in FIGS. 2F, 3C & 4D. In one or more embodiments, the deck is infinitely adjustable between its raised and lowered positions, which facilitates loading and/or unloading product in a variety of circumstances.

FIGS. 2A-2G depict one embodiment of an adjustable pallet, in accordance with one or more aspects of the present invention. The adjustable pallet depicted includes an adjustment mechanism to lower the deck of the rack substantially vertically, until it is close to the floor supporting the pallet, for instance, within about 1-2 inches of the floor, allowing a customer or service operator to readily push the wheeled rack gently off the pallet. As explained below, this embodiment utilizes multiple movable supports that translate horizontally in and out from the adjustable pallet, and include inclined planes that allow the deck of the pallet, with the product positioned on the deck, to transition towards the ground in a controlled manner. The inclined planes can be coated with a low-friction material (e.g., a wax, polyester film, plastic sheet, etc.) to aid in the transition of the deck from its raised position to the lowered position.

Figure 2A:
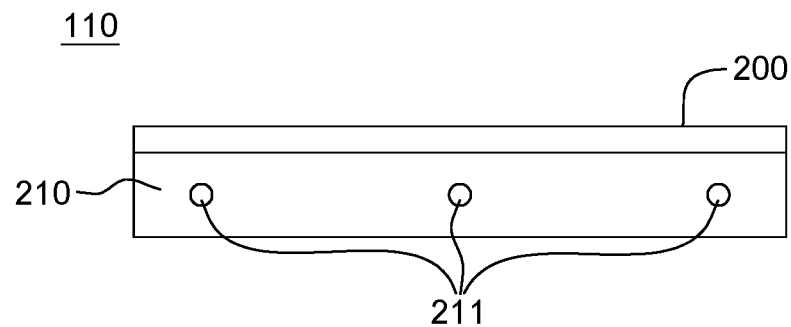
FIG. 2A depicts one embodiment of an adjustable pallet, in accordance with one or more aspects of the present invention.
Figure 2B:
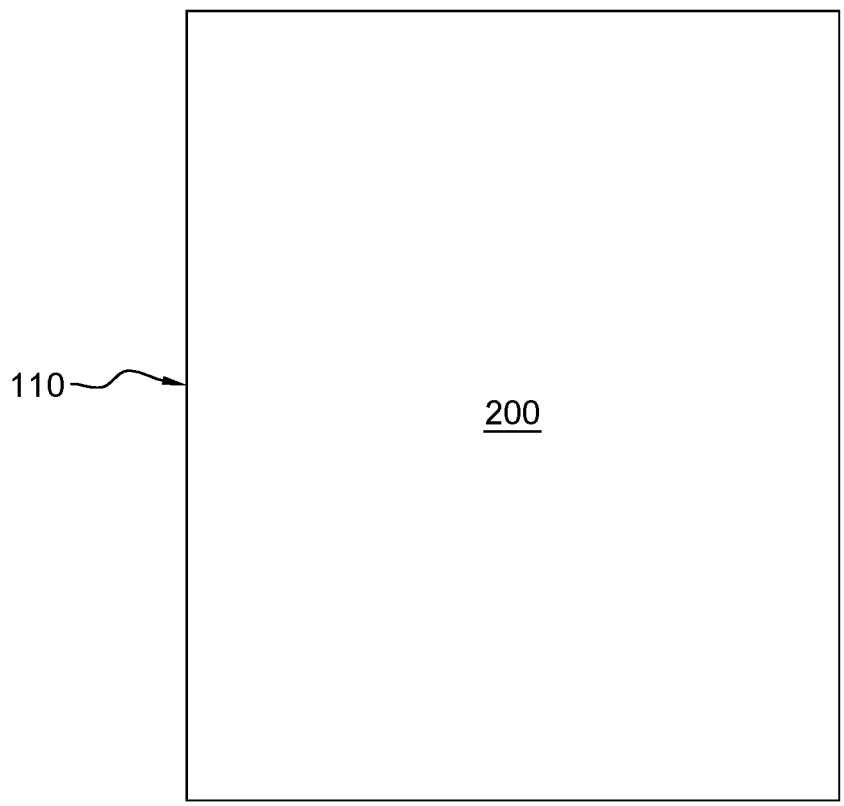
FIG. 2B is a plan view of the adjustable pallet of FIG. 2A, in accordance with one or more aspects of the present invention.
Figure 2C:
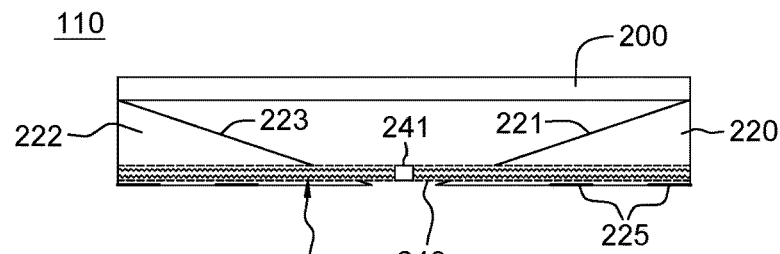
FIG. 2C depicts the adjustable pallet of FIGS. 2A-2B, with a side support removed, and showing the deck in raised position, as a horizontal support surface for a product, such as depicted in in FIG. 1, in accordance with one or more aspects of the present invention.
Figure 2D:
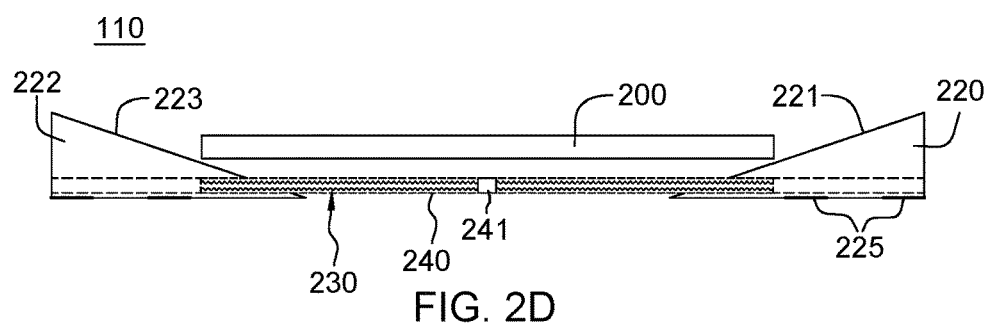
FIG. 2D depicts the adjustable pallet of FIGS. 2A-2C, with the deck traversing, at least in part, the inclined planes of the first and second movable supports, to facilitate transitioning the deck from the raised position to a lowered position, closer, at least in part, to a floor to facilitate loading product on or unloading product from the pallet, in accordance with one or more aspects of the present invention.
Figure 2E:
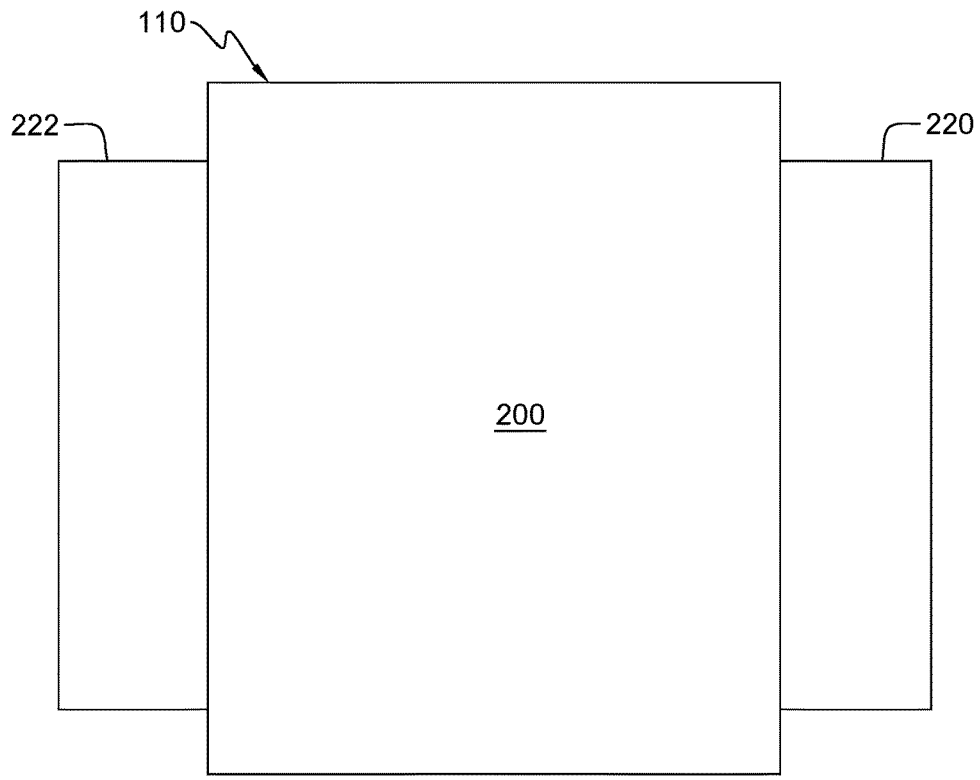
FIG. 2E is a plan view of the adjustable pallet configuration of FIG. 2D, with the first and second movable supports shown slid horizontally away from each other and extending, at least in part, from beneath the deck, in accordance with one or more aspects of the present invention.
Figure 2F:
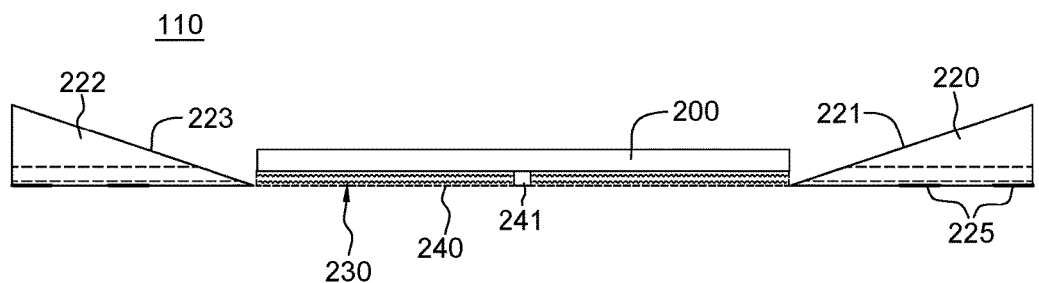
FIG. 2F depicts the adjustable pallet of FIGS. 2A-2E, with the deck shown in a lowered position, where the deck is closer to the floor supporting the adjustable pallet, in accordance with one or more aspects of the present invention.

Referring collectively to FIGS. 2A-2G, adjustable pallet 110 includes, in one or more embodiments, an upper deck 200 and a pallet structure supporting upper deck 200. The pallet structure includes one or more side supports or side stringers 210, which are fastened via fasteners 211, for instance, screws or bolts, as shown in operative position in FIG. 2A. The pallet structure can include, in one or more embodiments, a lower deck 240 and/or other pallet structure 241 providing, for instance, at least in part, a rigid base support for the adjustable pallet. In one or more implementations, opposite sides of deck 200 can have side supports 210, which can be removed before transitioning the deck from a raised position (such as shown in FIG. 2A) to a lowered position (such as shown in FIG. 2F). Side supports 210 advantageously strengthen the adjustable pallet when in the raised position to, for instance, facilitate shipment of palletized product. Although not shown, side supports 210 and/or movable supports 220, 222, can include openings sized to receive, for instance, the tines of a forklift, pallet jack, or other automatic or semi-manual device to be inserted into the pallet for moving the pallet.

FIG. 2B depicts a top plan view of one embodiment of adjustable pallet 110. Note that the size and configuration of the adjustable pallet, including deck 200, can vary as desired for a particular application. Additionally, the materials used to form the components of adjustable pallet 110 can vary and the components can include, by way of example, wood-based structures, metal structures, engineered plastic structures, etc. Further, in one or more embodiments, the adjustable pallet can be constructed as a composite of multiple materials, such as, a wooden structure with steel reinforcements 225 (FIG. 2C), such as 1-inch steel bottom deck boards recessed into one or more components of adjustable pallet 110.

FIG. 2C depicts adjustable pallet 110 with side supports 210 (FIG. 2A) removed to facilitate transitioning deck 200 from the raised position, illustrated in FIG. 2C, to a lowered position, such as illustrated in FIG. 2F. In the embodiment illustrated, adjustable pallet 110 includes a first movable support 220 and a second movable support 222, each triangular or wedge shape with an inclined plane 221, 223, respectively. As illustrated, a first edge of deck 200 rests on first movable support 220 in the raised position, and a second edge on second movable support 222 in the raised position, where the first and second edges are opposite edges of deck 200. In one or more embodiments, the first and second opposite edges of deck 200 could be angled, for instance, angled inward, so as to provide a greater contact surface with inclined planes 221, 223 as deck 200 is transitioned between raised and lowered positions. Further, note that one or more other edges of deck 200 could be sloped outwards, such as the opposite edges of the deck connecting the first and second edges. These outward sloped edges could facilitate loading product on the deck or unloading product from the deck when in the lowered position of the adjustable pallet shown in FIG. 2F.

An adjustment mechanism 230 is shown associated with the adjustable pallet. Adjustment mechanism 230 is mechanically coupled to a pallet structure, such as pallet structure 241 in the illustration provided. Pallet structure 241 can form part of the pallet support and/or part of a lower deck 240 of adjustable pallet 110. In one or more embodiments, adjustment mechanism 230 extends between pallet structure 241 and first movable support 220, as well as between pallet structure 241, and second movable support 222. The adjustment mechanism operatively moves the movable supports 220, 222 horizontally to allow the deck to traverse, at least in part, the inclined planes 221, 223 of the first and second movable support 220, 222, and thereby transition the deck between the raised position depicted in FIGS. 2A & 2C, and the lowered position depicted in FIG. 2F. Depending on the pallet structure 241 and/or lower deck 240 employed with adjustable pallet 110, adjustment mechanism 230 could reside, for instance, within a channel or opening formed in pallet structure 241 and/or lower deck 240. Further, in one or more embodiments, pallet structure 241 and/or adjustment mechanism 230 could recess, at least partially, into deck 200 as the deck is transitioned into its lowered position.

In one or more embodiments, adjustment mechanism 230 is a mechanical adjustment mechanism which includes one or more threaded rods, bolts, elongate screws, jack screws, etc., oriented horizontally, that can be tightened or loosened at one or both opposite sides of the pallet to actuate the first and second movable supports 220, 222, either independently, or together, as desired. By way of example, one end of the threaded rod, bolt, screw, jack screw, etc., could include an embossed, hexagonal head that allows for the rod, bolt or screw to spin freely within a T-nut, and allow for the insertion of a hex tool to facilitate a mechanical adjustment of the movable support(s) by rotation of the rod, bolt, screw, jack screw, etc. In one or more embodiments, the threaded rod, bolt, screw, jack screw, etc., could be a single structure extending substantially the width of the adjustable pallet, and include, on one side, a one-half, left-handed thread, and on the other side, a one-half, right-handed thread, so as to actuate both the first and second movable supports 220, 222 away from each other or towards each other, depending upon whether the deck 200 is to be raised or lowered, as desired. Those skilled in the art will note that other mechanical adjustment mechanisms could be employed to infinitely, horizontally adjust the position of movable supports 220, 222, and thus, the position of deck 200 between its raised position and lowered position.

FIG. 2D depicts deck 200 being transitioned from its raised position to a lower position by actuation of the threaded rod, bolt, screw, jack screw, etc., of the adjustment mechanism 230 to move deck 200 down inclined planes 221, 223 of first and second movable supports 220, 222. As noted, one or more integrated nuts, such as a T-nut, can be provided or affixed to each movable support in an appropriate position to facilitate moving the movable support with turning of the threaded rod, bolt, screw, jack screw, etc., of the adjustment mechanism. Further, T-channels can be provided within inclined planes 221, 223 to facilitate maintaining deck 200 captive to movable supports 220, 221.

FIG. 2E depicts one embodiment of the intermediate position of deck 200 of FIG. 2D, with first and second movable supports 220, 222 extending outwards from under the deck. As shown, with movement of the first and second movable supports horizontally away from each other, the deck traverses down the inclined planes of the movable supports, and the movable supports move outward from underneath deck 200.

Figure 2G:
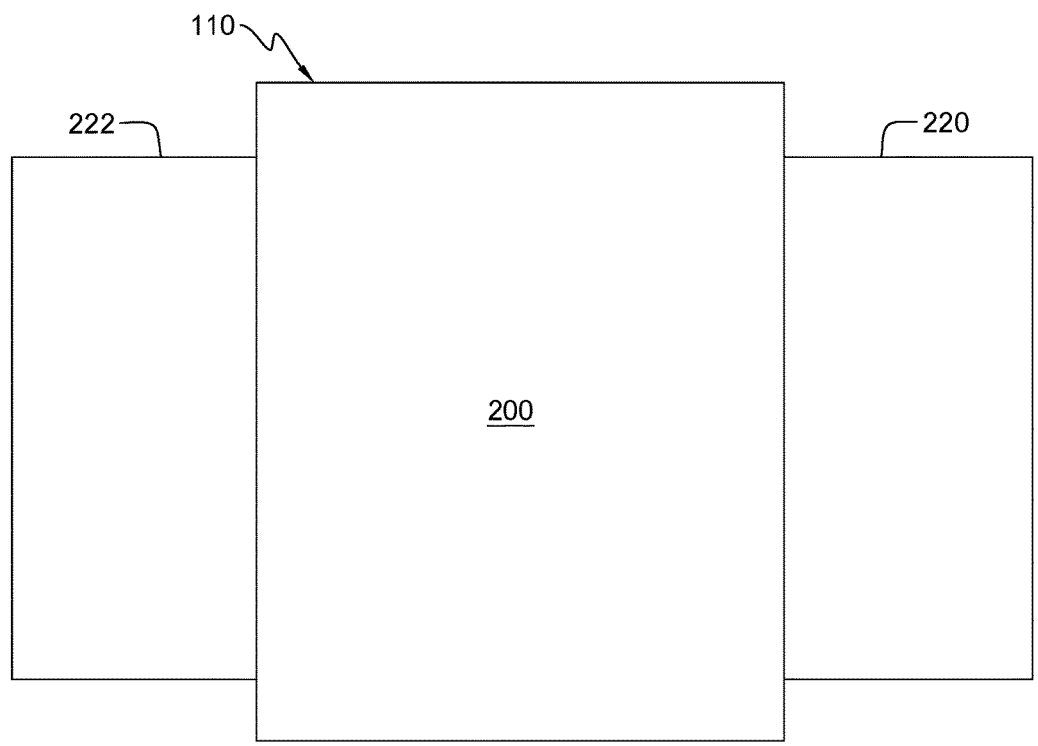
FIG. 2G is a plan view of the adjustable pallet configuration of FIG. 2F, with the first and second movable supports moved outward from the deck of the adjustable pallet in the lowered position, in accordance with one or more aspects of the present invention.

FIGS. 2F & 2G represent deck 200 of adjustable pallet 110 in the lowered position, close to the floor on which the adjustable pallet resides to facilitate unloading product from the pallet, or loading product on the pallet. As noted, one or more edges of deck 200 could be angled outward to facilitate the loading or unloading of product on or from the deck, respectively. Note that the elevational view of FIG. 2F is one embodiment only, with deck 200 shown close to the floor, for instance, within about an inch or two of the floor. Also note that, in one or more embodiments, adjustment mechanism 230 might not actually release first and second movable supports 220, 222 fully from the threaded rod, bolt, screw, jack screw, etc., 231, 232, but rather, horizontally move the movable supports to their furthest extent away from each other while still remaining connected, thereby lowering the deck to its closest position to the floor. In one or more other embodiments, the movable supports 220, 222 could be released from the adjustment mechanism when in the lowered position to allow, for instance, an operator to move one or more of the movable supports away from the deck when loading or unloading product.

Figure 3A:
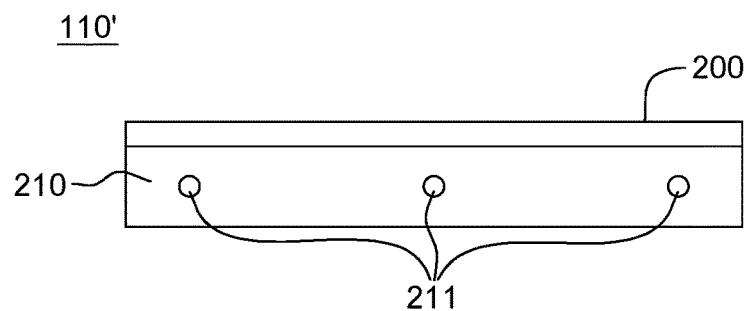
FIG. 3A depicts another embodiment of an adjustable pallet, in accordance with one or more aspects of the present invention.
Figure 3B:
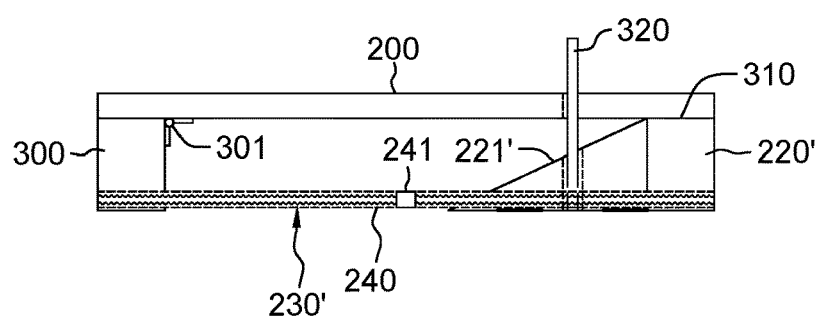
FIG. 3B depicts the adjustable pallet of FIG. 3A, with a side support removed, and showing the deck in raised position, as a horizontal support surface for a product, as well as showing a product stop in operative position, in accordance with one or more aspects of the present invention.
Figure 3C:
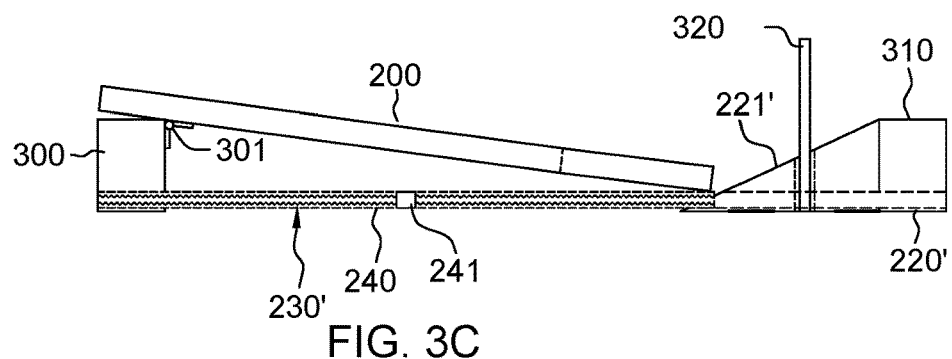
FIG. 3C depicts the adjustable pallet of FIGS. 3A-3B, with the deck shown transitioned to a lowered position, closer, in part, to a floor and illustrating the deck oriented as a ramp in the lowered position, in accordance with one or more aspects of the present invention.

FIGS. 3A-3C depict another embodiment of an adjustable pallet 110', in accordance with one or more aspects of the present invention. Unless noted otherwise, the configuration, materials and construction of adjustable pallet 110' can be the same or similar to those described above in connection with adjustable pallet 110 of FIGS. 2A-2G. In the embodiment of FIGS. 3A-3C, a similar inclined plane concept is utilized as in the adjustable pallet 110 embodiment of FIGS. 2A-2G, however, only one side or end of the pallet horizontally translates using the adjustable mechanism. The other side of the deck is hingedly secured to a fixed support of the pallet, and thus, as the one side of the deck slides down the inclined plane, the deck angles at it lowers to the ground, becoming a ramp. As in the embodiment described above, the inclined plane can be coated with a low-friction material such as a wax, polyester film, plastic sheet, etc., to aid in the transition of the deck along the inclined plane between raised and lowered positions.

Referring collectively to FIGS. 3A-3C, adjustable pallet 110' includes deck 200 supported, in part, by one or more side supports or stringers 210 which are affixed as part of the pallet structure via fasteners 211. In order to facilitate transitioning from the raised, shipping position illustrated in FIG. 3A, the side support(s) 210 is removed. Advantageously, in use, the side support makes the adjustable pallet more rigid, and limits it to two-way entry into the pallet.

As illustrated in FIG. 3B, upon removal of the side support(s), the adjustable pallet is ready to be transitioned from the raised position to a lowered position. The adjustable pallet 110' embodiment of FIGS. 3A-3C includes a fixed support member 300 affixed to one side of deck 200, for instance, via one or more hinges 301, and a movable support member 220', such as a movable wedge. In this configuration, movable support member 220' includes a flat upper support surface 310 supporting deck 200 at an opposite edge from the edge hingedly affixed to fixed support 300. Further, movable support 220' includes an inclined plane 221', and a product stop 320 associated with movable support 220'. In FIGS. 3B & 3C, product stop 320 is shown in an upward-extending, operative position to facilitate contacting and controlling product (not shown) on deck 200 when transitioning deck 200 from raised position to lowered position, such as the lowered position illustrated in FIG. 3C. Product stop 320 can take any desired configuration, and multiple product stops could be provided, if desired, to operate as a backstop to control product (such as a computing rack on casters) during descent of the pallet and product from the raised position to the lowered position.

Adjustment mechanism 230' is provided to facilitate horizontal sliding of movable support 220' from beneath deck 200 to, in part, extend outward from the deck, allowing the deck to slide down inclined plane 221', thereby transitioning the deck 200 from a substantially horizontal support in the raised position, to a ramp-type support in the lowered position, such as illustrated in FIG. 3C. Adjustment mechanism 230' can include one or more threaded rods, bolts, screws, jack screws, etc., coupled to pallet structure 241 of adjustable pallet 110'. In the embodiment depicted, adjustment mechanism 230' extends from the first edge to the second edge of deck 200, between fixed support 300 and movable support 220', by way of example only. For example, the threaded rod, bolt, screw, jack screw, etc., can include an embossed, hexagonal head that allows the structure to be turned within an appropriate T-nut, as well as allows for insertion of a hex tool to manually incrementally adjust or move movable support 220' between its location in the raised deck position and its location in the lowered deck position. The adjustment mechanism could be configured to allow the tool to rotate the threaded rod, bolt, screw, jack screw, etc., from either the fixed support 300 side or the movable support 220' side, with appropriate channels being provided through the supports, as illustrated. Note that, as with the embodiment of FIGS. 2A-2G, movable support 220' could be fully disengaged from the adjustment mechanism to allow the support to be moved away from the deck 200, if desired.

A further embodiment of an adjustable pallet 110" is depicted in FIGS. 4A-4D. Unless otherwise indicated, adjustable pallet 110" can be the same or similar to adjustable pallets 110, 110' described above in connection with FIGS. 2A-3C.

Figure 4A:
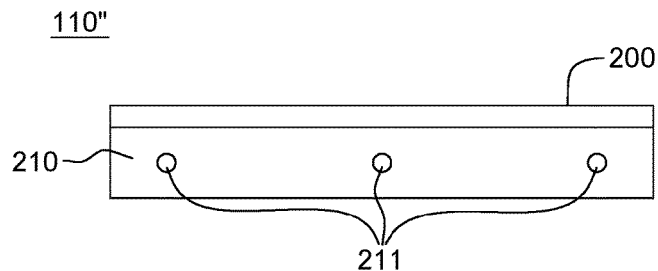
FIG. 4A depicts another embodiment of an adjustable pallet, in accordance with one or more aspects of the present invention.
Figure 4B:
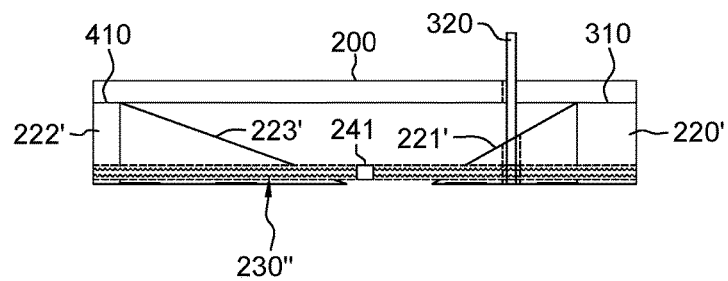
FIG. 4B depicts the adjustable pallet of FIG. 4A, with a side support removed, the deck shown in raised position, and a product stop shown in operative position, in accordance with one or more aspects of the present invention.

As illustrated in FIG. 4A, adjustable pallet 110" includes a deck 200 over a pallet structure which includes, for instance, one or more removable side supports or stringers 210, affixed to the pallet structure via one or more fasteners 211. In FIG. 4B, the side support(s) has been removed, to expose a first movable support 220', such as described above in connection with FIGS. 3A-3C, and a second movable support 222', similar to second movable support 222 of FIGS. 2A-2G. In particular, first movable support 220' includes a first inclined plane 221' and second movable support 222' includes a second inclined plane 223', which have different angles of incline.

Figure 4C:
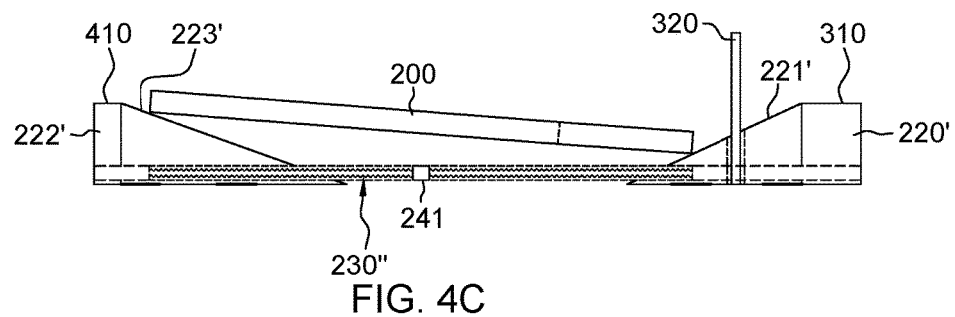
FIG. 4C depicts the adjustable pallet of FIGS. 4A-4B, with the deck partially transitioned from the raised position to a lowered position, in accordance with one or more aspects of the present invention.
Figure 4D:
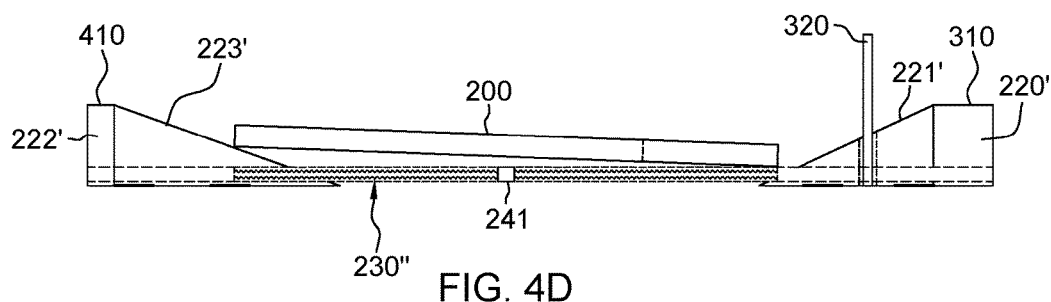
FIG. 4D depicts the adjustable pallet of FIGS. 4A-4C, with the deck shown, by way of example, in a lowered position, where the deck is closer to the floor and angled slightly as a ramp, in accordance with one or more aspects of the present invention.

In the embodiment depicted, the angle of incline of inclined plane 221' is greater than angle of incline of inclined plane 223'. This is to facilitate, in operation, lowering of the edge resting on first movable support 220' more than the edge resting on second movable support 222', such as illustrated in FIGS. 4C & 4D, resulting in the deck being oriented as a ramp in lowered position, but with a smaller slope compared with the adjustable pallet 110' embodiment of FIGS. 3A-3C.

As illustrated, first movable support 220' includes one or more product stops 320, and in the embodiment depicted, first movable support 220' includes a flat upper surface 310 to support deck 200 at a first edge in raised position, and second movable support 222' includes a flat upper surface 410 to support deck 200 at an opposite edge in raised position, such as illustrated in FIG. 4B.

The adjustable pallet embodiment of FIGS. 4A-4D is similar to that of FIGS. 3A-3C, with the exception that the fixed, hinged support is replaced by the second movable support 222', with the inclined plane 223'. In this embodiment, adjustment mechanism 230" couples to pallet structure 241 below deck 200, and extends between the pallet structure 241 and first movable support 220', as well as between pallet structure 241 and second movable support 222', as illustrated. Adjustment mechanism 230" can again be a mechanical adjustment mechanism, including one or more threaded rods, bolts, screws, jack screws, etc., that are coupled to translate rotation into linear movement of first and second movable supports 220', 222', either simultaneously, or separately, as desired for a particular application. Further, with the different incline angles, the adjustable mechanism can be configured to simultaneously lower opposite sides of the deck on the first and second movable members 220', 222' a set distance, which as illustrated FIGS. 4C & 4D, would result in the left edge of deck 200 remaining higher than the right edge, with any desired travel distance difference being achievable, depending on the requirements of the load, to enable a controlled and safe excursion of the load from the raised position of the adjustable pallet to the lowered position, and then to the floor.

As with the adjustable pallet embodiment of FIGS. 3A-3C, deck 200 in FIGS. 4A-4D becomes a ramp in lowered position, with infinitely adjustable ramp angles within the overall range between the raised and lowered positions. Further, if desired, the adjustment mechanism could be configured such that the first and second movable supports are separately controllable to provide, for instance, an operator with greater flexibility in raising or lowering the deck. Further, the adjustable pallet embodiment of FIGS. 4A-4D facilitates or enables reloading of the pallet by providing the ramp. The embedded ramp facility within the adjustable pallet embodiments of FIGS. 3A-4D provides for a controlled decent or ascent of product, enabling self-loading of the pallet by a customer, if desired. Further, a winch-like device could optionally be embedded or associated with the adjustable pallet, if desired.

Those skilled in the art will note from the above description that provided herein are adjustable pallet embodiments which allow for mechanical transition of the pallet deck between a raised position and a lowered position to facilitate loading product onto the pallet or unloading product from the pallet. Advantageously, the adjustable pallets disclosed eliminate the need for costly external devices to load large, heavy and/or tall equipment, racks, and other items onto pallets for shipping, manufacturing and/or distribution. In one or more embodiments, transition of the pallet from one position to the other does not require anything beyond readily available hand tools. A robust pallet design is presented with solid physical support of the load from full weight in transit to being fully compressed, or lowered, in the unloading position. The adjustable pallets presented are simple, and fast to load and unload, without significant tooling. Rather, only a hand tool is required which, in one or more embodiments, can be shipped integrated with the pallet. The adjustable pallets disclosed herein eliminate the safety hazard from significantly tilting large, heavy and/or tall equipment, racks, and other items with wheels to remove the product from a pallet. Further, the adjustable pallets disclosed herein eliminate any requirement for costly external devices to unload large, heavy and/or tall product(s) from a pallet at a final destination, or intermediate transfer point in the distribution process (e.g., customer data center, customer end location, retail store, distribution center, customer house, etc.). In fact, the adjustable pallets disclosed herein enable unpacking or repacking of heavy, wheeled items or products at any location. Further, the load and/or unload height is infinitely adjustable within the adjustable pallet's range of adjustment in order to facilitate, for instance, unloading in stepped facilities, raised curves, etc. Further, the adjustable pallets disclosed herein can be utilized as a lift for heavy, mobile/wheeled equipment. Designs with an overextended position are possible to allow the pallet to lift the product above obstacles in a data center, if desired. Further, the adjustable pallets disclosed are fully reusable as an adjustable pallet, as well as a standard shipping pallet. Robust mechanical adjustment mechanisms, and inclined plane designs ensure return on investment over many years of use.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An adjustable pallet comprising:
   a deck to support a product for shipping, the deck being selectively positionable in a raised position, as a horizontal support surface for the product, and in a lowered position, closer, at least in part, to a floor to facilitate unloading the product from the pallet; and
   a movable support, the movable support including an inclined plane, the deck resting on the movable support in the raised position, and the deck being capable of traversing, at least in part, the inclined plane of the movable support when the deck is transitioned between the raised position and the lowered position.

2. The adjustable pallet of claim 1, further comprising an adjustment mechanism mechanically coupled to a pallet structure disposed below the deck, the adjustment mechanism extending between the pallet structure and the movable support, wherein the adjustment mechanism operatively moves the movable support horizontally to allow the deck to traverse, at least in part, the inclined plane of the movable support, and thereby transition between the raised position and the lowered position.

3. The adjustable pallet of claim 2, wherein the adjustment mechanism comprises a mechanical adjustment mechanism extending in a horizontal direction beneath, at least in part, the deck.

4. The adjustable pallet of claim 2, wherein the adjustment mechanism facilitates horizontal sliding of the movable support from beneath the deck in the raised position to outward, at least in part, from beneath the deck in the lowered position.

5. The adjustable pallet of claim 1, wherein the movable support is a first movable support, and the adjustable pallet further comprises a second movable support, the second movable support including an inclined plane, and the deck also resting on the second movable support in the raised position, the deck further traversing, at least in part, the inclined plane of the second movable support when the deck is transitioned between the raised position and the lowered position, wherein a first edge of the deck resides on the first movable support in the raised position, and a second edge on the second movable support in the raised position, where the first edge and the second edge are opposite edges of the deck.

6. The adjustable pallet of claim 5, further comprising an adjustment mechanism mechanically coupled to a pallet structure disposed below the deck, the adjustment mechanism extending between the pallet structure and the first movable support, and between the pallet structure and the second movable support, wherein the adjustment mechanism operatively moves the first movable support and the second movable support horizontally away from each other to allow the deck to traverse, at least in part, the inclined plane of the first movable support and the inclined plane of the second movable support as the deck is transitioned from the raised position to the lowered position.

7. The adjustable pallet of claim 5, wherein the inclined plane of the first movable support is at a first angle, and the inclined plane of the second movable support is at a second angle, with the second angle being greater than the first angle.

8. The adjustable pallet of claim 7, wherein the second movable support further includes a product stop extending upwards from the second movable support to facilitate controlling the product on the deck when transitioning the deck between the raised position and the lowered position.

9. The adjustable pallet of claim 1, further comprising a fixed support, the deck being hingedly coupled to the fixed support at a first edge of the deck and residing on the movable support at a second edge of the deck in the raised position, where the first edge and the second edge are opposite edges of the deck.

10. The adjustable pallet of claim 9, wherein in the lowered position, the deck is angled as a ramp.

11. An adjustable pallet comprising:
    a deck to support a product for shipping, the deck being selectively positionable in a raised position, as a horizontal support surface for the product, and in a lowered position, closer, at least in part, to a floor to facilitate unloading the product from the pallet;
    a movable support, the movable support including an inclined plane, the deck resting on the movable support in the raised position, and the deck being capable of traversing, at least in part, the inclined plane of the movable support when the deck is transitioned between the raised position and the lowered position; and
    an adjustment mechanism mechanically coupled to a pallet structure of the adjustable pallet disposed below the deck, the adjustment mechanism extending between the pallet structure and the movable support, wherein the adjustment mechanism operatively moves the movable support horizontally to allow the deck to traverse, at least in part, the inclined plane of the movable support, and thereby transition between the raised position and the lowered position, the adjustment mechanism being a mechanical adjustment mechanism comprising a horizontally-extending threaded rod.

12. The adjustable pallet of claim 11, wherein the adjustment mechanism facilitates horizontal sliding of the movable support from beneath the deck in the raised position to outward, at least in part, from beneath the deck in the lowered position.

13. The adjustable pallet of claim 11, wherein the movable support is a first movable support, and the adjustable pallet further comprises a second movable support, the second movable support including an inclined plane, and the deck also resting on the second movable support in the raised position, the deck further traversing, at least in part, the inclined plane of the second movable support when the deck is transitioned between the raised position and the lowered position, wherein a first edge of the deck resides on the first movable support in the raised position, and a second edge on the second movable support in the raised position, where the first edge and the second edge are opposite edges of the deck, and wherein the adjustment mechanism further mechanically couples between the pallet structure and the second movable support, the adjustment mechanism operatively moves the first movable support and the second movable support horizontally away from each other to allow the deck to traverse, at least in part, the inclined plane of the first movable support and the inclined plane of the second movable support as the deck is transitioned from the raised position to the lowered position.

14. The adjustable pallet of claim 13, wherein the inclined plane of the first movable support is at a first angle, and the inclined plane of the second movable support is at a second angle, with the second angle being greater than the first angle.

15. The adjustable pallet of claim 11, further comprising a fixed support, the deck being hingedly coupled to the fixed support at a first edge of the deck and residing on the movable support at a second edge of the deck in the raised position, where the first edge and the second edge are opposite edges of the deck.

16. The adjustable pallet of claim 15, wherein in the lowered position, the deck is angled as a ramp.

17. A method of fabricating an adjustable pallet, the method comprising:
  providing a deck to support a product for shipping, the deck being selectively positionable in a raised position, as a horizontal support surface for the product, and in a lowered position, closer, at least in part, to a floor to facilitate unloading the product from the pallet; and
  supporting the deck, at least in part, by a movable support, the movable support including an inclined plane, the deck resting on the movable support in the raised position, and the deck traversing, at least in part, the inclined plane of the movable support when the deck is transitioned between the raised position and the lowered position.

18. The method of claim 17, further comprising providing an adjustment mechanism mechanically coupled to a pallet structure disposed below the deck, the adjustment mechanism extending between the pallet structure and the movable support, wherein the adjustment mechanism operatively moves the movable support horizontally to allow the deck to traverse, at least in part, the inclined plane of the movable support, and thereby transition between the raised position and the lowered position.

19. the method of claim 18, wherein the adjustment mechanism facilitates horizontal sliding of the movable support from beneath the deck in the raised position to outward, at least in part, from beneath the deck in the lowered position.

20. The method of claim 19, wherein the movable support is a first movable support, and the method further comprises providing a second movable support, the second movable support including an inclined plane, and the deck also resting on the second movable support in the raised position, the deck further traversing, at least in part, the inclined plane of the second movable support when the deck is transitioned between the raised position and the lowered position, wherein a first edge of the deck resides on the first movable support in the raised position, and a second edge on the second movable support in the raised position, where the first edge and the second edge are opposite edges of the deck, and wherein the adjustment mechanism further mechanically couples between the pallet structure and the second movable support, and operatively moves the first movable support and the second movable support horizontally away from each other to allow the deck to traverse, at least in part, the inclined plane of the first movable support and the inclined plane of the second movable support as the deck is transitioned from the raised position to the lowered position.

* * * * *